(12) United States Patent
Bertrand et al.

(10) Patent No.: US 10,233,540 B2
(45) Date of Patent: Mar. 19, 2019

(54) DEVICE FOR LOADING POROUS SUBSTRATES OF THREE-DIMENSIONAL SHAPE IN ORDER TO BE DENSIFIED BY DIRECTED FLOW CHEMICAL VAPOR INFILTRATION

(75) Inventors: Sébastien Bertrand, Moulis en Medoc (FR); Franck Lamouroux, Le Taillan (FR); Stéphane Goujard, Merignac (FR)

(73) Assignee: SAFRAN CERAMICS, Le Haillan (FR)

(*) Notice: Subject to any disclaimer, the term of this patent is extended or adjusted under 35 U.S.C. 154(b) by 664 days.

(21) Appl. No.: 14/348,412

(22) PCT Filed: Sep. 14, 2012

(86) PCT No.: PCT/FR2012/052066
§ 371 (c)(1),
(2), (4) Date: Oct. 24, 2014

(87) PCT Pub. No.: WO2013/045788
PCT Pub. Date: Apr. 4, 2013

(65) Prior Publication Data
US 2015/0075428 A1   Mar. 19, 2015

(30) Foreign Application Priority Data
Sep. 28, 2011 (FR) .................... 11 58673

(51) Int. Cl.
*C23C 16/455* (2006.01)
*C23C 16/458* (2006.01)
*C23C 16/04* (2006.01)

(52) U.S. Cl.
CPC .......... *C23C 16/045* (2013.01); *C23C 16/455* (2013.01); *C23C 16/458* (2013.01)

(58) Field of Classification Search
CPC ............ C23C 16/4583; H01J 37/32715; H01J 2237/03; H01L 21/67303; H01L 21/6732;
(Continued)

(56) References Cited

U.S. PATENT DOCUMENTS 5,169,478 A * 12/1992 Miyamoto .............. C23C 16/44
                                                        118/725
5,221,354 A *  6/1993 Rigney .................. C23C 10/06
                                                        118/715
(Continued)

FOREIGN PATENT DOCUMENTS

WO      2006087495 A1    8/2006

OTHER PUBLICATIONS

International Search Report for corresponding International PCT Application No. PCT/FR2012/052066, dated Nov. 27, 2012.

*Primary Examiner* — Rakesh K Dhingra
*Assistant Examiner* — Laureen Chan
(74) *Attorney, Agent, or Firm* — Workman Nydegger

(57) ABSTRACT

A loader device for loading porous substrates of three-dimensional shapes extending mainly in a longitudinal direction into a reaction chamber of an infiltration oven for densification of the preforms by directed flow chemical vapor infiltration. The device comprising at least one annular loader stage formed by first and second annular vertical walls arranged coaxially relative to each other and defining between them an annular loader space for the porous substrates to be densified. First and second plates respectively cover the bottom portion and the top portion of the annular loader space. The first and second annular vertical walls include support elements arranged in the annular loader space so as to define between them unit loader cells, each for receiving a respective substrate to be densified. The device (Continued)

also comprises gas feed orifices and gas exhaust orifices in the vicinity of each unit loader cell.

6 Claims, 15 Drawing Sheets

(58) Field of Classification Search
CPC ............ H01L 21/67363; H01L 21/683; H01L 21/67712
See application file for complete search history.

(56) References Cited

U.S. PATENT DOCUMENTS

| | | | |
|---|---|---|---|
| 5,904,957 A | 5/1999 | Christin et al. | |
| 8,163,088 B2 | 4/2012 | Lamouroux et al. | |
| 8,491,963 B2 | 7/2013 | Lamouroux et al. | |
| 2003/0116278 A1* | 6/2003 | Wheat | C23C 10/06 156/345.33 |
| 2004/0237898 A1 | 12/2004 | Bernard et al. | |
| 2008/0152803 A1* | 6/2008 | Lamouroux | C23C 16/045 427/248.1 |
| 2009/0084502 A1* | 4/2009 | Hayashi | H01J 37/32623 156/345.35 |
| 2012/0171375 A1 | 7/2012 | Lamouroux et al. | |

* cited by examiner

DEVICE FOR LOADING POROUS SUBSTRATES OF THREE-DIMENSIONAL SHAPE IN ORDER TO BE DENSIFIED BY DIRECTED FLOW CHEMICAL VAPOR INFILTRATION

BACKGROUND OF THE INVENTION

The present invention relates to the techniques of chemical vapor infiltration that are used in particular when making parts out of thermostructural composite material. The invention relates more particularly to densifying porous substrates of complex three-dimensional shape such as fiber preforms for use in fabricating aeroengine blades, the substrates being densified by depositing a matrix therein.

In order to fabricate parts out of composite material, and in particular parts made of thermostructural composite material constituted by a refractory fiber preform (using carbon or ceramic fibers, for example) that is densified by a refractory matrix (e.g. made of carbon and/or ceramic), it is common practice to use chemical vapor infiltration methods. Examples of such parts are thruster nozzles made of carbon-carbon (C—C) composite, brake disks, in particular for airplane brakes, made of C—C composites, or blades made of ceramic matrix composites (CMCs).

Densifying porous substrates by means of chemical vapor infiltration consists in placing the substrates in a reaction chamber of an infiltration installation by using support tooling, and then in admitting a reagent gas into the chamber, with one or more ingredients of the reagent gas being precursors of the material that is to be deposited within the substrates in order to densify them. Infiltration conditions, and in particular the composition and the flow rate of the reagent gas, and also the temperature and the pressure inside the chamber, are selected so as to enable the gas to diffuse within the accessible internal pores of the substrates so as to deposit the desired material therein, as a result of one of the ingredients of the gas decomposing, or of a reaction taking place between a plurality of its ingredients. It is common practice for the reagent gas to be preheated by passing the gas through a preheating zone situated in the reaction chamber and into which the reaction gas inlet opens out. That method corresponds to the free-flow chemical vapor infiltration method.

In an industrial installation for chemical vapor infiltration, it is common practice to load the reaction chamber with a plurality of substrates or preforms that are to be densified simultaneously in order to increase the throughput of the densification method, and consequently to increase the load factors of reaction chambers.

Methods and installations for densifying porous annular substrates by chemical vapor infiltration are described in particular in documents: US 2004/237898 and U.S. Pat. No. 5,904,957. Nevertheless, those methods relate essentially to densifying substrates of annular shape arranged in stacks and they are not suitable for densifying substrates that present shapes that are not axisymmetric.

Document US 2008/0152803 describes using loader tooling comprising a tubular duct arranged between first and second plates and having thin substrates with the shape of the plate that is to be densified arranged radially therearound. The tooling as loaded in this way is then placed inside a reaction chamber of an infiltration oven having its reagent gas admission inlet connected to the tubular duct so as to enable a reagent gas to be admitted into the duct, which then distributes the gas along the main faces of the substrates in a flow direction that is essentially radial.

Nevertheless, that loader tooling remains limited to directed flow densification of substrates that are thin and simple in shape such as thin rectangular plates, and it does not make it possible to obtain uniform densification of substrates that are of complex three-dimensional shape such as fiber preforms for blades. The flow of a gas stream over substrates that are of complex three-dimensional shape is more difficult to control. The lack of control over the flow of the reagent gas over the set of substrates to be densified leads to the appearance of densification gradients in the substrates. However, it is the uniformity with which a substrate is densified that determines the mechanical performance of the resulting part.

OBJECT AND SUMMARY OF THE INVENTION

An object of the invention is to provide a loading solution that enables porous substrates to be densified, in particular thin substrates of complex three-dimensional shape extending mainly in a longitudinal direction, with a high loading capacity, and to do so while minimizing densification gradients in the substrates.

This object is achieved with a loader device comprising:

at least one annular loader stage formed by first and second annular vertical walls arranged coaxially relative to each other and defining between them an annular loader space for the porous substrates to be densified;

first and second plates respectively covering the bottom portion and the top portion of the annular loader space;

each of the first and second annular vertical walls including support elements arranged in the annular loader space, the support elements of the first and second annular vertical walls being in radial alignment so as to define between them unit loader cells each for receiving a respective substrate to be densified; and the device also including at least one gas feed orifice and at least one gas exhaust orifice in the vicinity of each unit loader cell.

The loader device of the invention makes it possible to optimize the number of substrates that can be densified simultaneously in a given installation while simultaneously controlling the flow direction of the reagent gas in each substrate so as to densify it uniformly. Such densification in large numbers cannot be obtained with substrates that are as close to one another as when the flow is not directed.

Consequently, the method of the invention makes it possible to densify thin porous substrates, and to do so while increasing both the quality of the parts that are obtained and also the volume of the reaction chamber that is loaded.

Once the loader device of the invention has been placed in a reaction chamber, it acts as a mini-reactor in which the flow of gas is under control. With this device, a load of substrates can be prepared in advance away from the densification installation, and can be transported easily without risk to the reaction chamber. This serves to reduce the time required for loading and unloading chambers.

In an embodiment of the device of the invention, the first annular vertical wall of each loader stage includes at least one gas feed orifice in the vicinity of each unit loader cell, while the second annular vertical wall of each loader stage includes at least one gas exhaust orifice in the vicinity of each unit loader cell.

In an aspect of the invention, the loader device comprises a plurality of annular loader stages stacked on one another and arranged between the first and second plates.

In another embodiment of the device of the invention, the first plate has gas feed orifices in register with each unit loader cell, while the second plate has gas exhaust orifices in register with each unit loader cell.

In an aspect of the invention, the loader device comprises a plurality of annular loader stages stacked on one another and arranged between the first and second plates.

In another aspect of the invention, the loader device further includes a plurality of annular loader stages of different radial dimensions, said stages being arranged coaxially relative to one another.

The invention also provides an installation for densifying porous substrates by chemical vapor infiltration, the porous substrates being of three-dimensional shape that extends mainly in a longitudinal direction, the installation comprising a reaction chamber, a reagent gas admission pipe situated at a first end of the chamber, and an exhaust pipe situated in the vicinity of a second end of the chamber remote from the first, the installation being characterized in that the chamber contains a plurality of porous substrates of three-dimensional shape extending mainly in a longitudinal direction, said substrates being arranged in a loader device comprising a plurality of loader stages of the invention, the gas feed orifice(s) of said device being fed with reagent gas via the reagent gas admission pipe of the chamber.

The invention also provides an installation for densifying porous substrates by chemical vapor infiltration, the porous substrates being of three-dimensional shape that extends mainly in a longitudinal direction, the installation comprising a reaction chamber, a plurality of reagent gas admission pipes situated at a first end of the chamber, and at least one exhaust pipe situated in the vicinity of a second end of the chamber remote from the first, the installation being characterized in that the chamber contains a plurality of porous substrates of three-dimensional shape extending mainly in a longitudinal direction, said substrates being arranged in one or more loader devices, each comprising a plurality of annular loader stages stacked and/or arranged coaxially relative to one another and having their gas feed and exhaust orifices formed respectively in the first and second plates, the gas feed orifice(s) of each device being fed with reagent gas via the reagent gas admission pipes of the chamber.

In particular, the loader devices may have the same diameter and may be arranged in juxtaposed manner in the reaction chamber, or they may be of decreasing diameter and stacked on one another in a pyramid structure.

BRIEF DESCRIPTION OF THE DRAWINGS

Other characteristics and advantages of the invention appear from the following description of particular embodiments of the invention given as non-limiting examples and with reference to the accompanying drawings, in which.

DETAILED DESCRIPTION OF EMBODIMENTS

Figure 1:
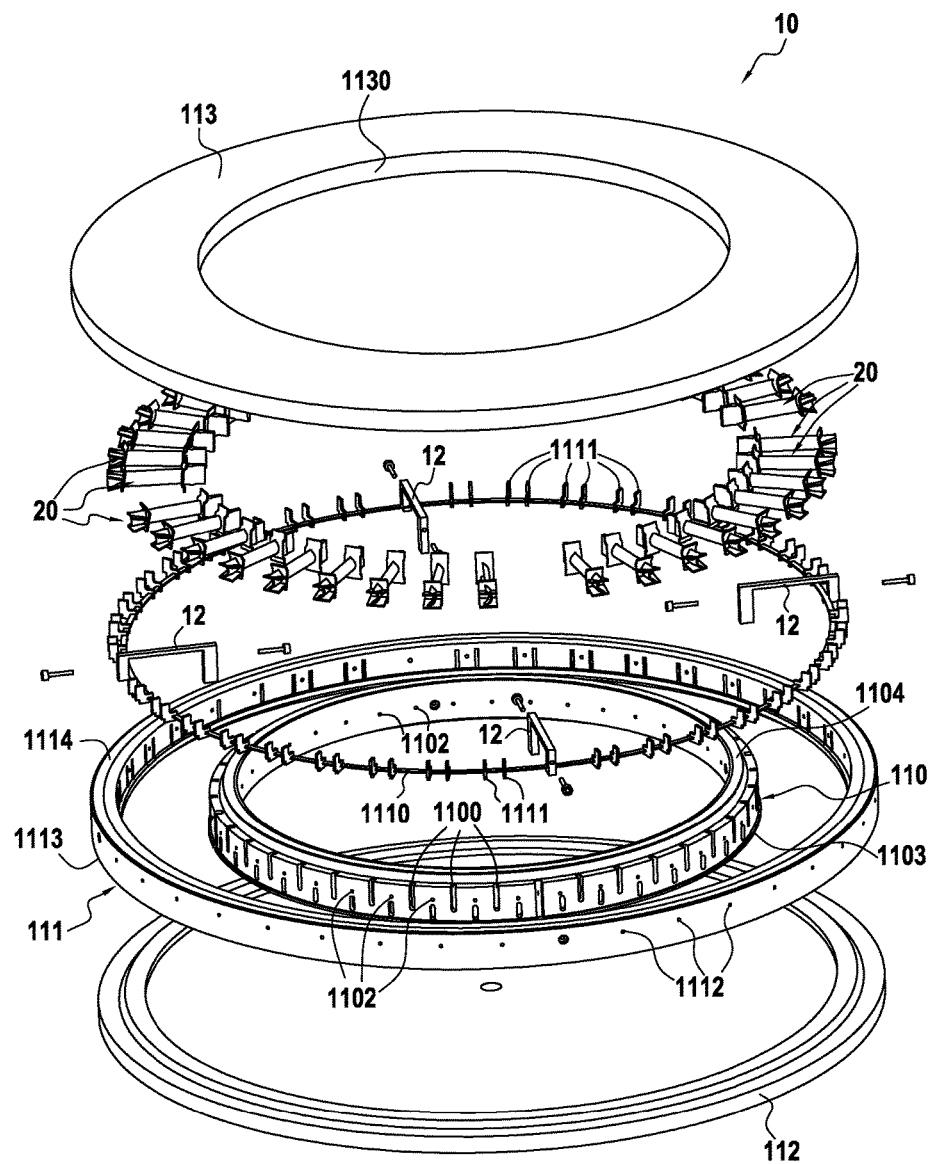
FIGS. 1 and 2 are perspective views of a loader device in accordance with an embodiment of the invention.
Figure 2:
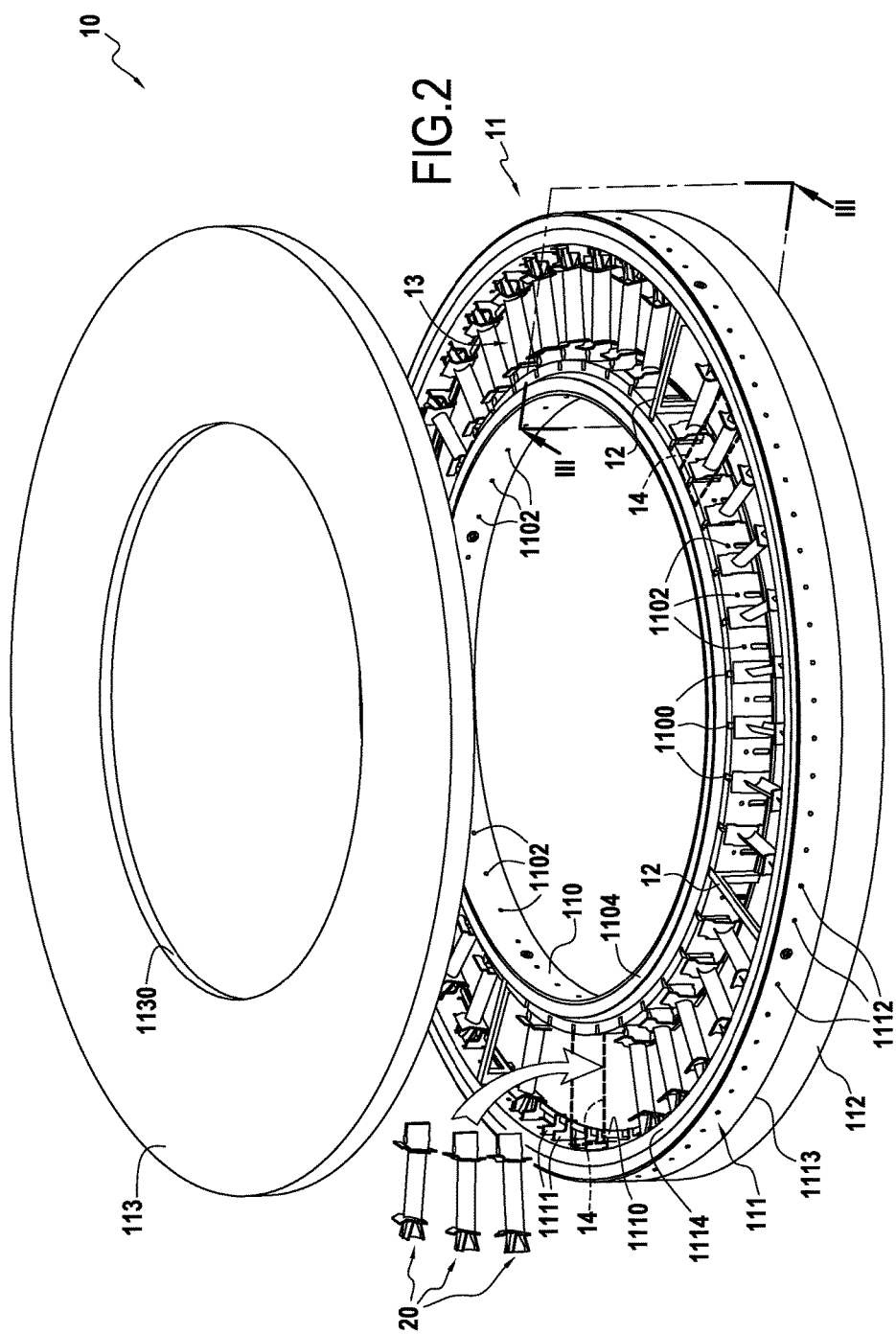
Figure 3:
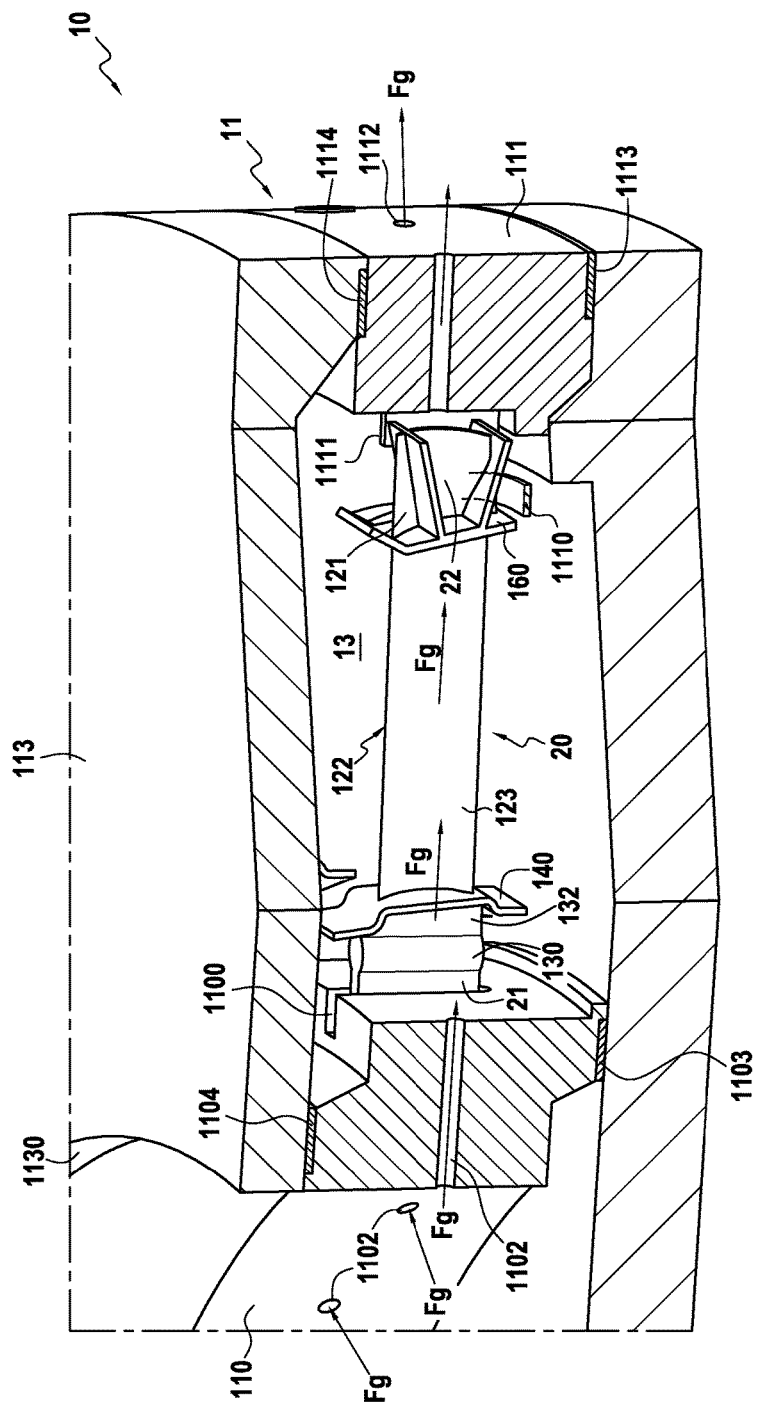
FIG. 3 is a fragmentary section view showing the device of FIGS. 1 and 2 while densifying porous substrates.

FIGS. 1 to 3 show a loader device or tooling 10 that, once loaded with substrates for densifying, is to be inserted in a reaction chamber in an industrial installation for chemical vapor infiltration. In the presently-described example, the tooling 10 is designed to receive fiber preforms 20 for aeroengine blades.

Each preform 20 extends in a longitudinal direction between two ends 21 and 22 and comprises an airfoil 120 and a root 130 formed by a portion of greater thickness, e.g. having a bulb-shaped section that is extended by a tang 132 (FIG. 3). The airfoil 120 extends in a longitudinal direction between its root 130 and its tip 121 and in cross-section it presents a curved profile of varying thickness defining two faces 122 and 123 that correspond respectively to the suction side and to the pressure side of the airfoil 120. In the presently-described example, the airfoil 120 also has an inner platform 140 for the blade and an outer platform 160 for the blade.

The presently-described loader device 10 comprises an annular loader stage 11 (FIG. 2) made up of an inner first annular vertical wall 110 and an outer second annular vertical wall 111. The walls 110 and 111 are held coaxially relative to each other by spacers 12 so as to define between them an annular space 13 for loading the preforms 120. Each vertical wall is provided with support elements for receiving one of the ends 21 and 22 of the blade preforms 20. More precisely, the inner annular vertical wall 110 has notches 1100 distributed uniformly over the outer periphery of the wall 110. The notches 1100 are designed to receive the ends 21 of the preforms 20. The outer annular vertical wall 111 has a ring 1110 fastened to the bottom portions of the spacers 12, such that a gap in a radial direction is formed between the ring 1110 and the outer annular vertical wall 111. The ring 1110 is for supporting the ends 22 of the preforms 20. In the presently-described example, the ring 1110 also includes a plurality of pairs of dividers 1111 for separating the ends 22 of the adjacent blades. Each pair of dividers 1111 is in radial alignment with a notch 1100 so as to define a unit loader cell 14 (FIG. 2) that is to receive a preform 20. Once the preforms 20 have been positioned in the loader device 10, they extend radially between the walls 110 and 111, thus serving to optimize the loading capacity of the tooling. Furthermore, the use of support means at the annular vertical walls makes it possible to minimize the contact areas between the loader device and the substrates for densifying, and consequently to optimize the area that is accessible for infiltration by the reagent gas.

In accordance with a first embodiment of the invention, each of the walls 110 and 111 has a plurality of gas-passing orifices. More precisely, the inner annular vertical wall 110 has orifices 1102 each arranged between two adjacent notches so as to feed two adjacent unit loader cells 14 simultaneously. The outer annular vertical wall 111 has orifices 1112 each arranged in register with a unit loader cell.

The annular loader space 13 defined between the walls 110 and 111 is closed in its bottom portion by a first plate 112 and in its top portion by a second plate 113. The second plate 113 presents a central opening 1130 for connection to a pipe for feeding a reagent gas to a reaction chamber of a densification installation or oven so as to feed the orifices 1102 with reagent gas. In order to ensure good sealing of the annular loader space 13, the inner annular vertical wall 110 has two annular gaskets 1103 and 1104 placed respectively on its bottom and top edges, while the outer annular vertical wall 111 likewise has two annular gaskets 1113 and 1114 placed respectively on its bottom and top edges.

FIG. 3 shows the loader device 10 in its densification configuration, i.e. with the preforms 20 loaded and with the plates 112 and 113 mounted respectively on the bottom and top edges of the walls 110 and 111. As described in greater detail below, the loader device 10 is placed in a reaction chamber of a chemical vapor infiltration installation or oven into which a stream of reagent gas Fg is admitted. The reagent gas stream Fg is introduced into the annular loader space 13 via the orifices 1102 in the inner annular vertical wall 110. The residual gas is exhausted via the orifices 1112 in the outer annular vertical wall 111. Because of the radial arrangement of the preforms 20 in the loader device 10, and because of the presence of gas-passing orifices 1102 and 1112 in register with each unit loader cell, it is possible to direct the reagent gas stream over the entire length of the preforms 20 for densifying and as close as possible to them, thus obtaining uniform densification of the preforms.

Figure 4:
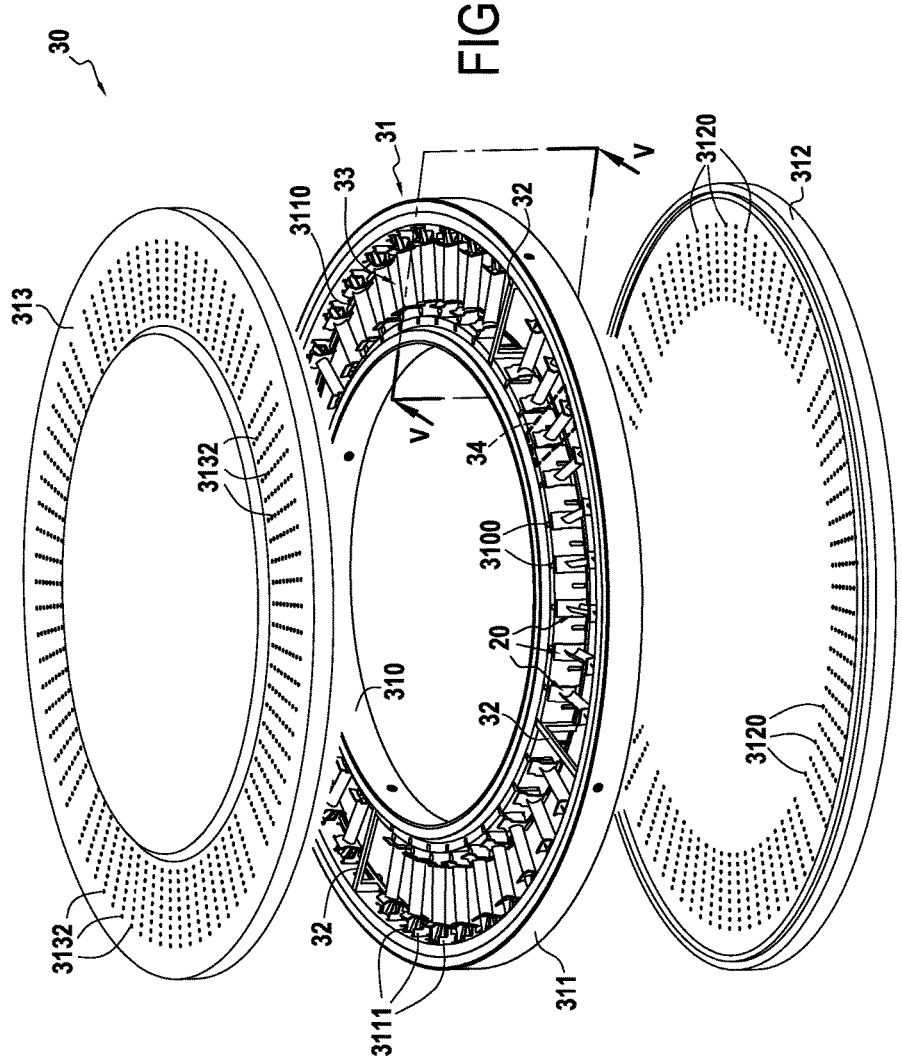
FIG. 4 is a perspective view of a loader device in accordance with another embodiment of the invention.
Figure 5:
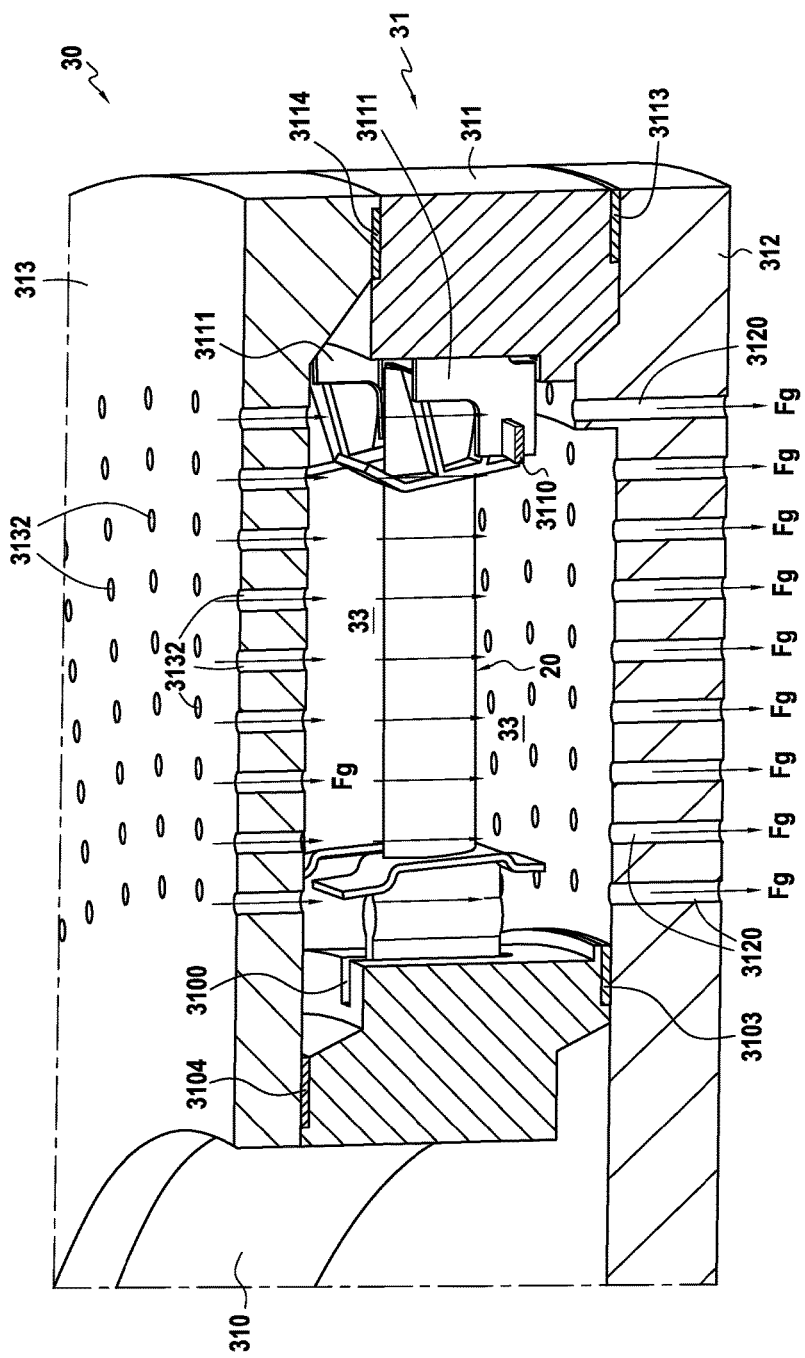
FIG. 5 is a fragmentary section view showing the FIG. 4 device while densifying porous substrates.

FIGS. 4 and 5 show a loader device 30 that differs from the above-described device 10 in that the orifices for passing a flow of reagent gas through the annular loader space are provided in the annular plate for closing the loader space.

As for the device 10 shown in FIGS. 1 and 2, the loader device 30 has an annular loader stage 31 formed by an inner first annular vertical wall 310 and an outer second annular vertical wall 311 that are held coaxially relative to each other by spacers 32 so as to define between them an annular space 33 for loading the preforms 20. The inner annular vertical wall 310 has notches 3100, while the outer annular vertical wall 311 has a ring 3110 fastened on the bottom portions of the spacers 32 and provided with a plurality of pairs of dividers 3111. The space that is present between each pair of dividers 3111 and the facing notch 3100 forms a unit loader cell 34 for a preform 20. The preforms 20 are arranged in the unit loader cell 34 and they extend radially between the walls 310 and 311.

The annular loader space 33 defined between the walls 310 and 311 is closed in its bottom portion by a first annular plate 312 and in its top portion by a second annular plate 313, with annular gaskets 3103, 3104, 3113, and 3114 providing good sealing between the plates 312 and 313 and the walls 310 and 311.

In the presently-described embodiment, each of the plates 312 and 313 has orifices for passing a reagent gas through the annular loader space 33. More precisely, each annular plates 312 and 313 has a plurality of series of orifices 3120 and 3132 extending radially below or above each unit loader cell 34. In the presently-described example, the bottom annular plate 312 has a series of nine orifices under each unit loader cell 34. Likewise, the top annular plate 313 has a series of nine orifices over each unit loader cell 34.

In the loader device 30, the reagent gas stream Fg is introduced into the annular loader space from the orifices 3120 or 3132 and its residues are exhausted via the orifices 3132 or 3120 (FIG. 5). In each unit loader cell 34, this serves to create a plurality of reagent gas flow paths that are uniformly distributed along the loader cell, thereby enabling the entire preform to be covered and making it possible to obtain uniform densification thereof.

The above-described loader devices comprise a single loader stage, i.e. a single annular loader space. Nevertheless, the loader device of the invention may have a plurality of loader stages arranged relative to one another in a manner that is optimized in terms of occupancy within the infiltration installation.

In a first aspect of the invention, the loader device has a plurality of annular loader stages stacked on one another.

Figure 6:
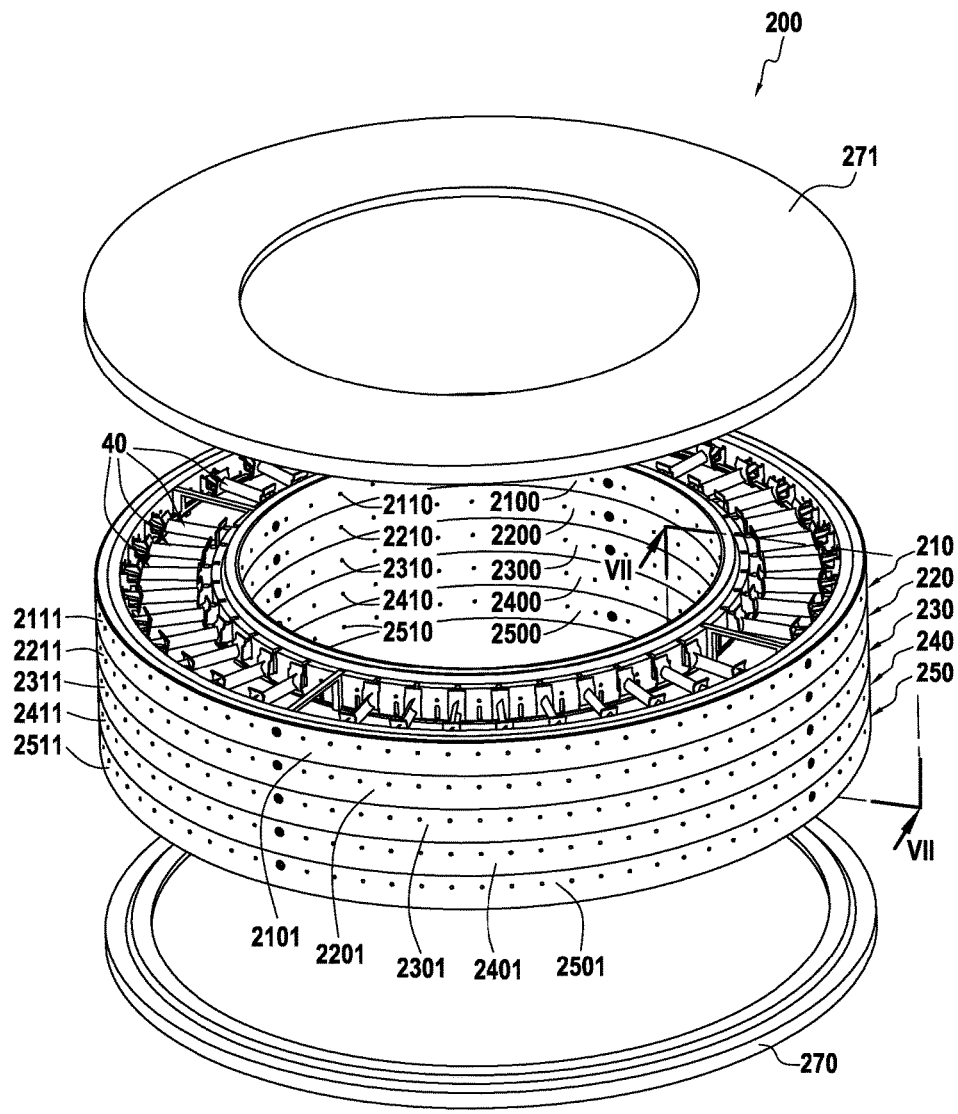
FIG. 6 is a perspective view of a loader device comprising a plurality of stacked loader stages in accordance with another embodiment of the invention.
Figure 7:
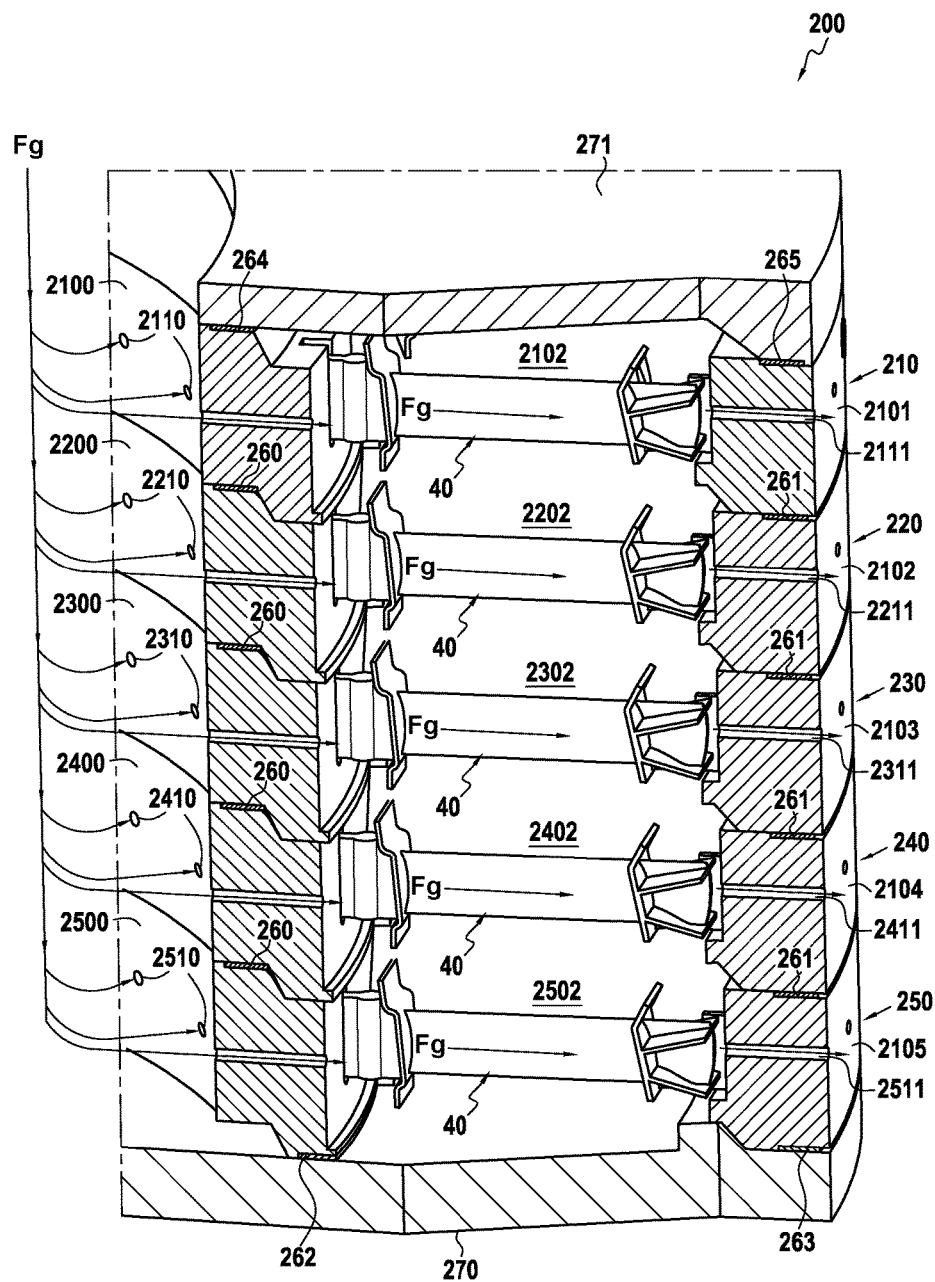
FIG. 7 is a fragmentary section view showing the FIG. 6 device while densifying porous substrates.

FIGS. 6 and 7 show a loader device 200 comprising a plurality of annular loader stages 210, 220, 230, 240, and 250 that are stacked on one another and that are formed respectively by inner annular vertical walls 2100, 2200, 2300, 2400, and 2500, and outer annular vertical walls 2101, 2201, 2301, 2401, and 2501, and that define between them respective annular loader spaces 2102, 2202, 2302, 2402, and 2502. Each of the stages 210, 220, 230, 240, and 250 presents a structure similar to the structure of the stage 11 described above with reference to FIGS. 1 and 2 and for simplification purposes it is not described again in detail.

Annular gaskets 260 and 261 are arranged on the top edges of the respective inner annular vertical walls 2200, 2300, 2400, and 2500, and outer annular vertical walls 2201, 2301, 2401, and 2501 in order to provide sealing between the annular loader stages 210, 220, 230, 240, and 250.

The bottom portion of the loader device 200 constituted by the annular loader stage 250 is closed by a first annular plate 270 with two annular gaskets 262 and 263 being interposed between it and the bottom edges of the inner and outer annular vertical walls 2500 and 2501 of the stage 250, while the top portion of the loader device 200 constituted by the annular loader stage 210 is closed by a second annular plate 271 with two annular gaskets 264 and 265 being interposed between it and the top edges of the inner and outer annular vertical walls 2100 and 2101 of the stage 210.

Once the stages 210, 220, 230, 240, and 250 have been loaded with blade fiber preforms 40, the stack constituted by the loader device 200 is fed in its center with a reagent gas so that the stream Fg of reagent gas penetrates into the annular loader spaces 2102, 2202, 2302, 2402, and 2502 of the respective stages 210, 220, 230, 240, and 250 via the orifices 2110, 2210, 2310, 2410, and 2510 of the inner annular vertical walls 2100, 2200, 2300, 2400, and 2500. After passing through the annular loader spaces 2102, 2202, 2302, 2402, and 2502, the reagent gas residues are extracted via the orifices 2111, 2211, 2311, 2411, and 2511 of the outer annular vertical walls 2101, 2201, 2301, 2401, and 2501.

Figure 8:
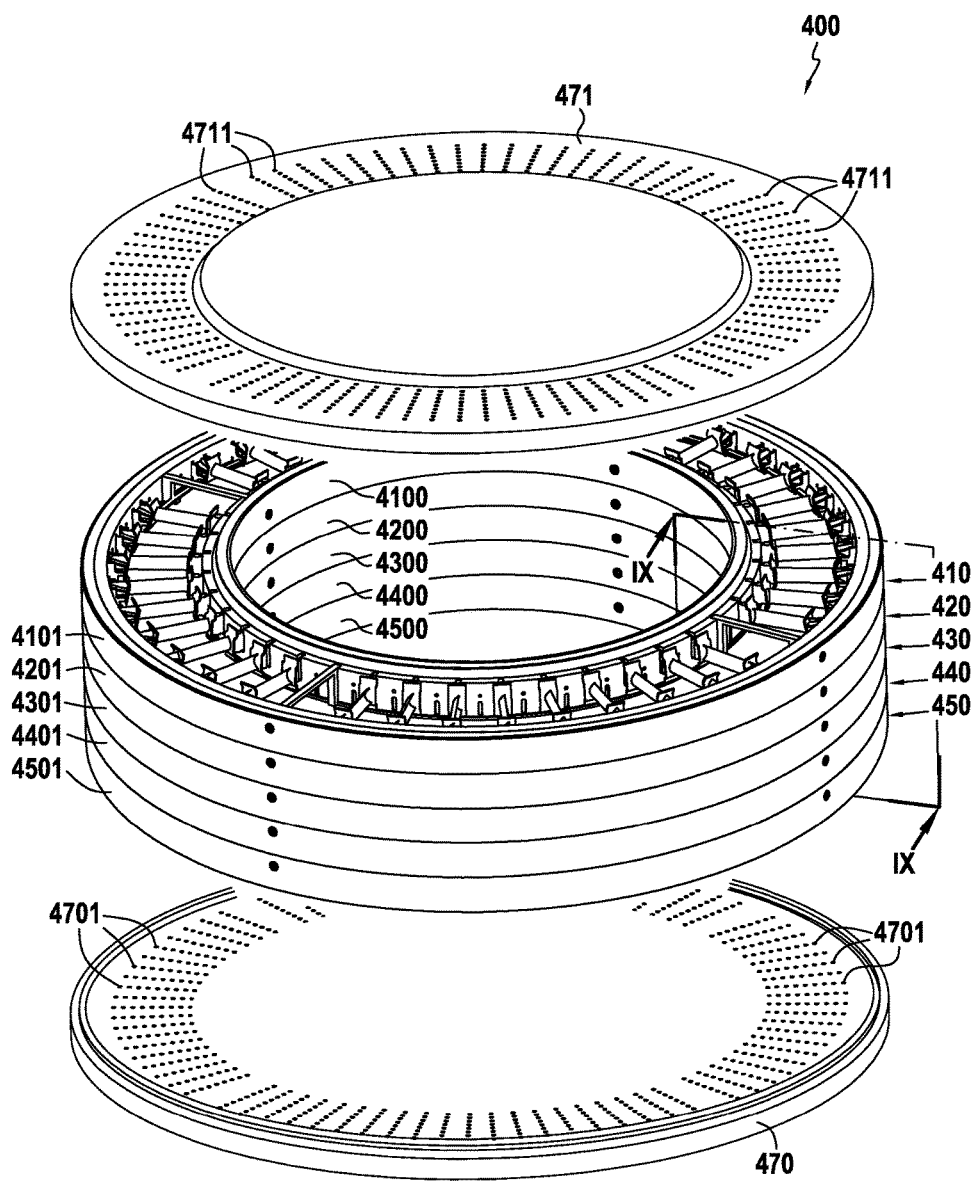
FIG. 8 is a perspective view of a loader device comprising a plurality of stacked loader stages in accordance with another embodiment of the invention.
Figure 9:
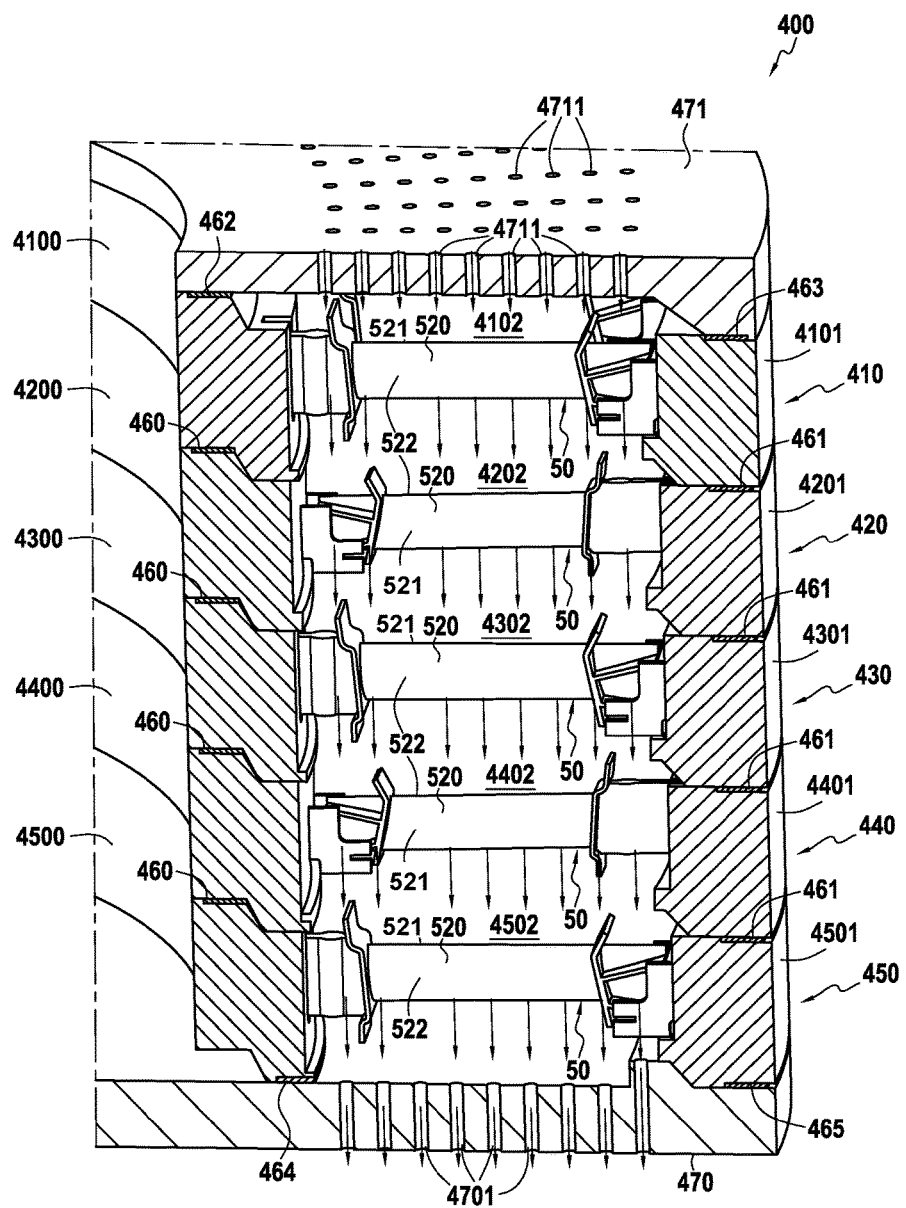
FIG. 9 is a fragmentary section view showing the FIG. 8 device while densifying porous substrates.

FIGS. 8 and 9 show a loader device 400 comprising a plurality of annular loader stages 410, 420, 430, 440, and 450 that are stacked on one another to define respective annular loader spaces 4102, 4202, 4302, 4402, and 4502. Blade fiber preforms 50 are arranged in each of these annular loader spaces as described above. Each of the stages 410, 420, 430, 440, and 450 presents a structure similar to the structure of the stage 31 described with reference to FIG. 4 and for simplification purposes it is not described again in detail.

Annular gaskets 460 and 461 are arranged on the top edges of the respective inner and outer annular vertical walls 4200, 4300, 4400, & 4500 and 4201, 4301, 4401, & 4501, in order to provide sealing between the annular loader stages 410, 420, 430, 440, and 450.

The bottom portion of the loader device 400 constituted by the annular loader stage 450 is closed by a first annular plate 470 with two annular gaskets 462 and 463 being interposed between it and the bottom edges of the inner and outer annular vertical walls 4500 and 4501 of the stage 410, while the top portion of the loader device 400 constituted by the annular loader stage 410 is closed by a second annular plate 471 with two annular gaskets 464 and 465 being interposed between it and the top edges of the inner and outer annular vertical walls 4100 and 4101 of the stage 410.

Each plate 470 and 471 has a respective plurality of series of orifices 4701 and 4711 extending radially along the plates. During densification of the fiber preforms 50 in the loader device 400, a reagent gas stream Fg is introduced, e.g. from the orifices 4711 and travels successively through the annular loader spaces 4102, 4202, 4302, 4402, and 4502. Under such circumstances, the reagent gas residues are exhausted from the loader device 400 via the orifices 4701. Naturally, the reagent gas could be caused to flow through the device in the opposite direction, i.e. it could be introduced into the device via the orifices 4701 and exhausted via the orifices 4711.

When densifying blade fiber preforms with a loader device comprising a plurality of annular loader stages fed with reagent gas via orifices in the closure plates, as in the loader device 400, the Applicant has observed that a better flow of reagent gas is obtained when the airfoils of the blade preforms are at different orientations in two adjacent loader stages. More precisely, and as shown in FIG. 9, the blade preforms 50 present in the annular loader stages 410, 430, and 450 are arranged therein with the suction side faces 522 of their airfoils 520 facing clockwise in the corresponding annular loading space, while the blade preforms 50 present in the stages 420 and 440 are arranged therein with the suction side faces 522 of their airfoils 520 facing counterclockwise in the corresponding annular loading space. By causing the pressure side 521 (or suction side) faces of the blade preforms to face in alternation in a clockwise direction and in a counterclockwise direction on going from one loader stage to another in the stack, the gas is better distributed between the preforms situated closest to the reagent gas inlet into the loader device and the preforms situated farthest from said inlet, thus making it possible, consequently, to obtain densification of the preforms in the loader device that is more uniform.

In a second aspect of the invention, the loader device comprises a plurality of annular loader stages that are arranged coaxially relative to one another.

Figure 10:
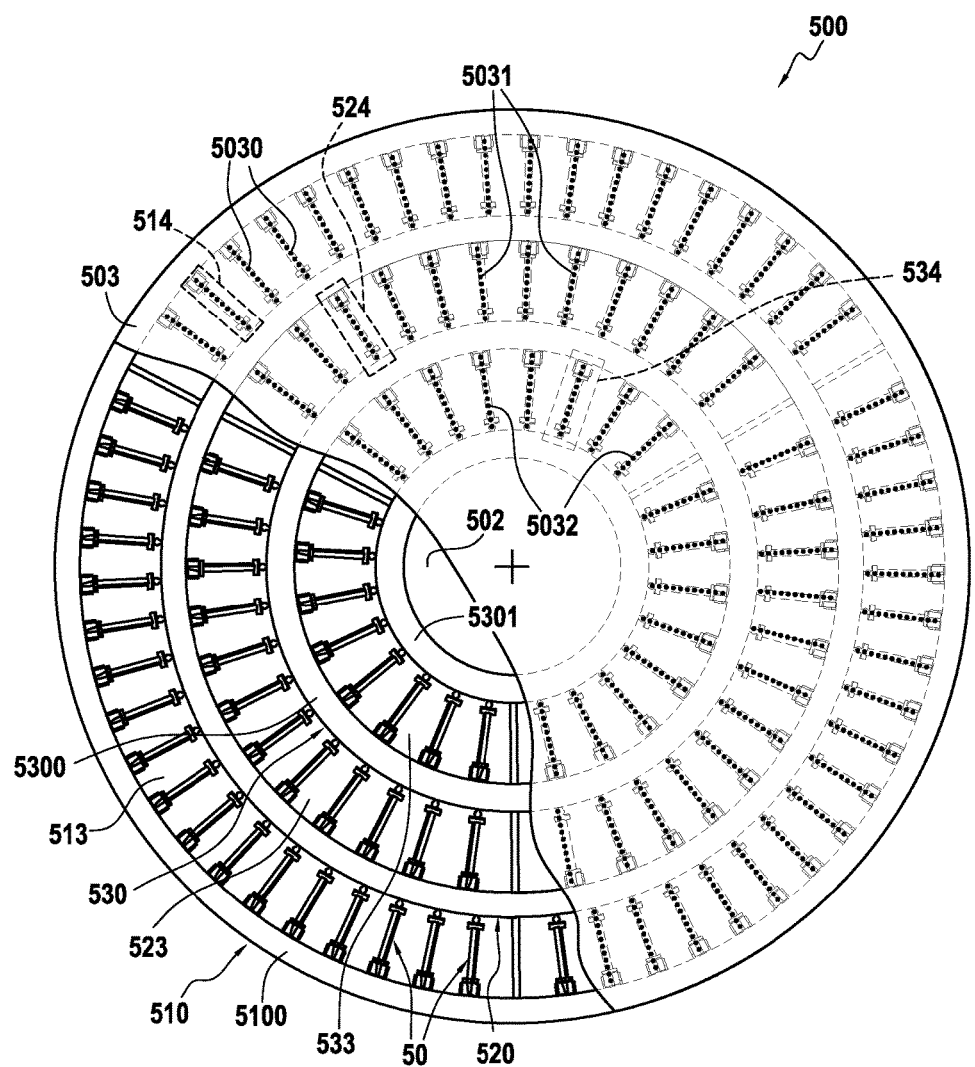
FIG. 10 is a perspective view of a loader device comprising a plurality of coaxial loader stages in accordance with another embodiment of the invention.

FIG. 10 shows a loader device 500 comprising a plurality of annular loader stages 510, 520, and 530 presenting different diameters and arranged coaxially relative to one another. Each of the stages 510, 520, and 530 presents a structure similar to the structure of the stage 31 described above with reference to FIG. 4 and for simplification purposes it is not described again in detail. In the presently-described example, the loader device has four annular vertical walls 5100, 5200, 5300, and 5301 presenting respective decreasing diameters. The stage 510 has an annular loader space 513 defined by the annular vertical walls 5100 and 5200. The stage 520 comprises an annular loader space 523 defined by the annular vertical walls 5200 and 5300. Finally, the stage 530 comprises an annular loader space 533 defined by the annular vertical walls 5300 and 5301. Blade fiber preforms 60 are loaded in each of the annular loader spaces 513, 523, and 533 respectively of the stages 510, 520, and 530.

The bottom portion of the loader device 500 is closed by a first plate 502 while the top portion of the loader device 500 is closed by a second plate 503 that is annular. As described above for the loader device 30 of FIG. 4, each of the plates 502 and 503 has orifices for allowing a reagent gas to pass into the annular loader space.

More precisely, as shown in FIG. 10, the plate 503 has a first plurality of series of orifices 5030 that are distributed around the annular loader space 513 of the stage 510, each series extending radially over each unit loader cell 514. Likewise, the plate 503 has a second plurality of series of orifices 5031 that are distributed around the annular loader space 523 of the stage 520, each series extending radially over each unit loader cell 524. Finally, the plate 503 has a third plurality of series of orifices 5032 that are distributed around the annular loader space 523 of the stage 520, each series extending radially over each unit loader cell 524. First, second, and third series of gas flow orifices are made in similar manner in the plate 502 (not shown in FIG. 10).

For the loader device 500, the reagent gas stream is introduced into the annular loader spaces 513, 523, and 533 via gas flow orifices formed in the plate 502 or in the plate 503, and its residues are exhausted via the gas flow orifices formed in the plate 503 or in the plate 502.

In a variant embodiment, the loader device has a plurality of annular loader stages presenting different diameters and arranged coaxially relative to one another as shown in FIG. 10, but with each of the coaxial stages presenting a structure similar to the structure of the stage 11 described above with reference to FIG. 2. Under such circumstances, the gas-passing orifices of the annular vertical walls common to two adjacent loader stages are placed so as to open out into unit loader cells of two adjacent stages. Under such circumstances, the quantity of reagent gas that is introduced into the first loader stage is increased so that a sufficient quantity of gas remains in all of the other coaxial stages through which it is to flow.

Figure 11:
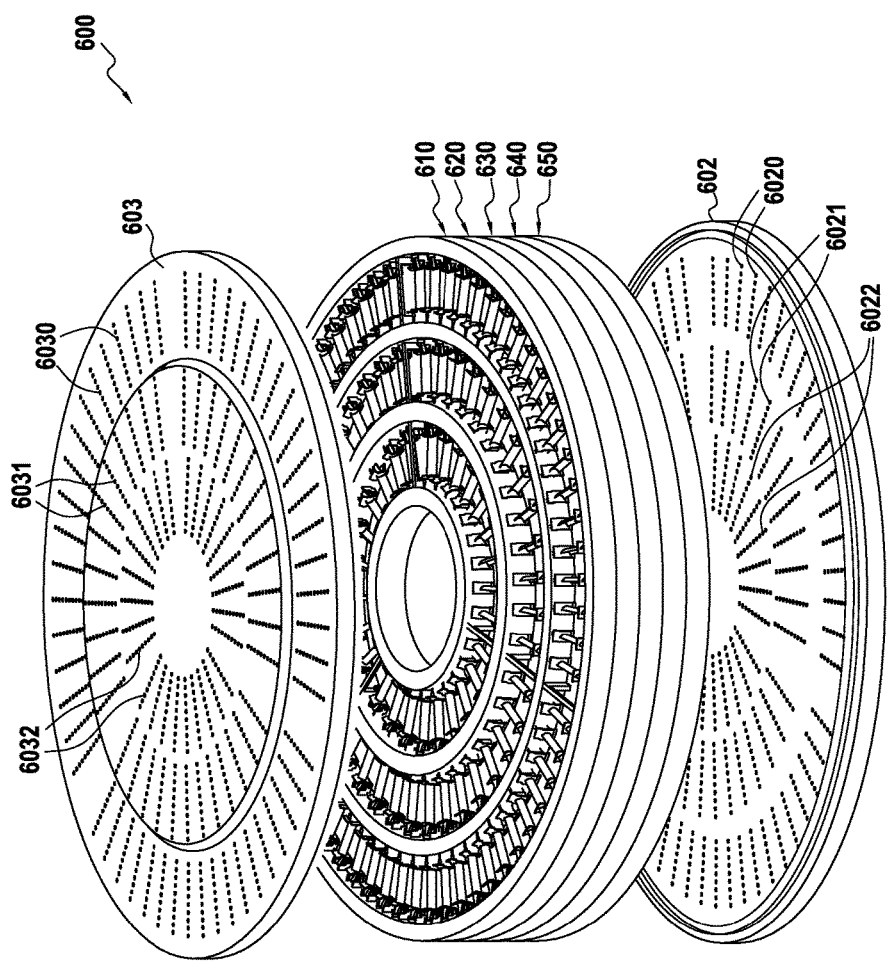
FIG. 11 is a perspective view of a loader device comprising a plurality of loader stages that are coaxial and stacked in accordance with another embodiment of the invention.

The loader device of the invention may also comprise a plurality of annular loader stages, some of which are arranged to be coaxial relative to one another and others of which are stacked on one another as shown in FIG. 11, which shows a loader device 600 comprising five loader sub-devices 610, 620, 630, 640, and 650 similar to the loader device 500 of FIG. 10, i.e. each constituted by at least three loader stages arranged coaxially relative to one another. The five loader sub-devices 610, 620, 630, 640, and 650 are also stacked on one another, the bottom portion of the stack constituted by the stage 650 being closed by a plate 602 having three series of gas flow orifices 6020, 6021, and 6022 arranged around the annular loader space of the stage 650, each series extending radially over each unit loader cell. Likewise, the top portion of the stack constituted by the stage 610 is closed by a plate 603 having three series of gas flow orifices 6030, 6031, and 6032 distributed around the annular loader space of the stage 610, each series extending radially over each unit loader cell.

The loader device of the invention, regardless of whether it has one or more annular loader stages that are stacked on one another or arranged coaxially relative to one another, behaves like a mini-reactor enabling the substrates it contains to be densified in independent manner. Consequently, when the capacity of the reaction chamber of the densification oven or installation makes this possible, a plurality of devices may be arranged in a single chamber. Numerous loading configurations can thus be envisaged.

Figure 12:
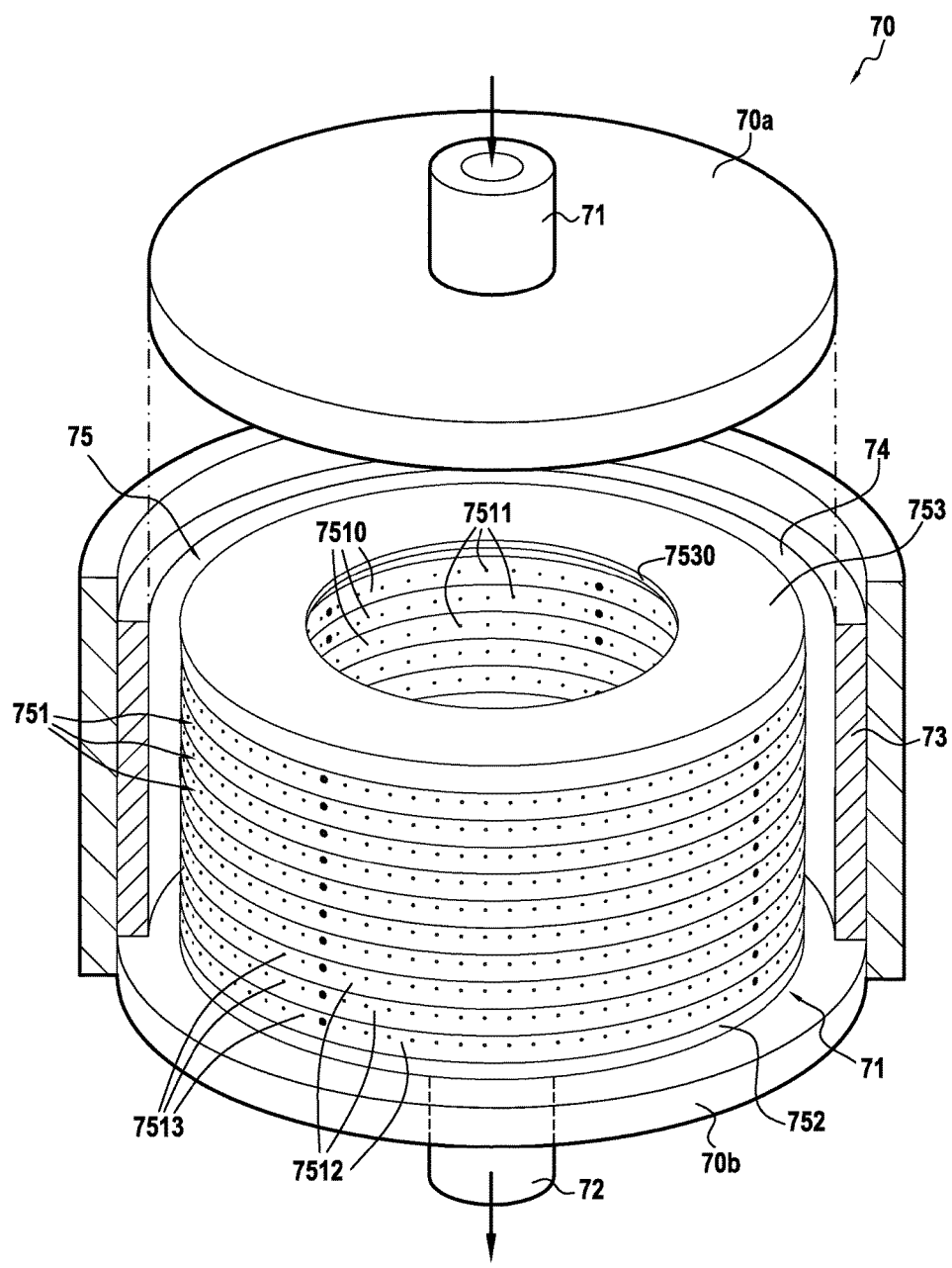
FIG. 12 is a diagrammatic section view showing an installation for densification by chemical vapor infiltration in which substrates are loaded by means of a loader device comprising a plurality of stacked loader stages of the invention of the type shown in FIG. 6.

FIG. 12 is a diagram showing a reaction chamber 70 of a chemical vapor infiltration installation or oven having substrates for densifying loaded therein. The chamber 70 is generally cylindrical in shape.

In order to densify the substrates, a reagent gas containing one or more precursors for the material of the matrix that is to be deposited is introduced into the chamber 70. For example, when the material is carbon, gaseous hydrocarbon compounds are used, typically propane, or methane, or a mixture of both. When the material is ceramic, e.g. such as silicon carbide (SiC), it is possible in known manner to use methyltrichlorosilane (MTS) as a precursor for SiC.

In well-known manner, porous substrates are densified by depositing matrix material within them, this material being produced by decomposition of the precursor contained in the reagent gas diffusing within the accessible internal pores of the substrates. The temperature and pressure conditions needed for obtaining a variety of matrix deposits by chemical vapor infiltration are themselves well known.

In the example shown, the reagent gas is conveyed by an admission pipe 71 that leads into the top portion of the chamber. The residual gas is extracted from the bottom portion of the chamber via an exhaust pipe 72 that is connected to suction means (not shown).

The inside of the chamber is heated by a graphite susceptor 73 forming a secondary circuit that is electromagnetically coupled with an induction coil (not shown). The susceptor 73 co-operates with the lid 70*a* through which the pipe 71 passes and the bottom 70*b* through which the pipe 72 passes to define the inside volume 74 of the chamber. The bottom and the lid are likewise made of graphite.

In order to densify porous substrates, such as blade fiber preforms, for example, the preforms are loaded in the inside volume 74 of the chamber 70 by means of a loader device 75 made up of a plurality of loader stages 751 arranged between a bottom plate 752 and a top plate 753. The structure and the operation of the loader device 75 are similar to the structure and the operation of the device 200 described with reference to FIGS. 6 and 7. The central opening 7530 in the top plate 753 is connected to the reagent gas admission pipe 71 so as to feed the loader stages 751 of the device 75 via the gas feed orifices 7511 present in the inner embodiments 7510 of said stages. The residual gas exhausted via the exhaust orifices 7513 present in the outer walls 7512 of the loader stages 751 of the device 75 is extracted from the chamber via the exhaust pipe 72. The flow of the reagent gas stream through the loader device 75 is as shown in FIG. 7.

Figure 13:
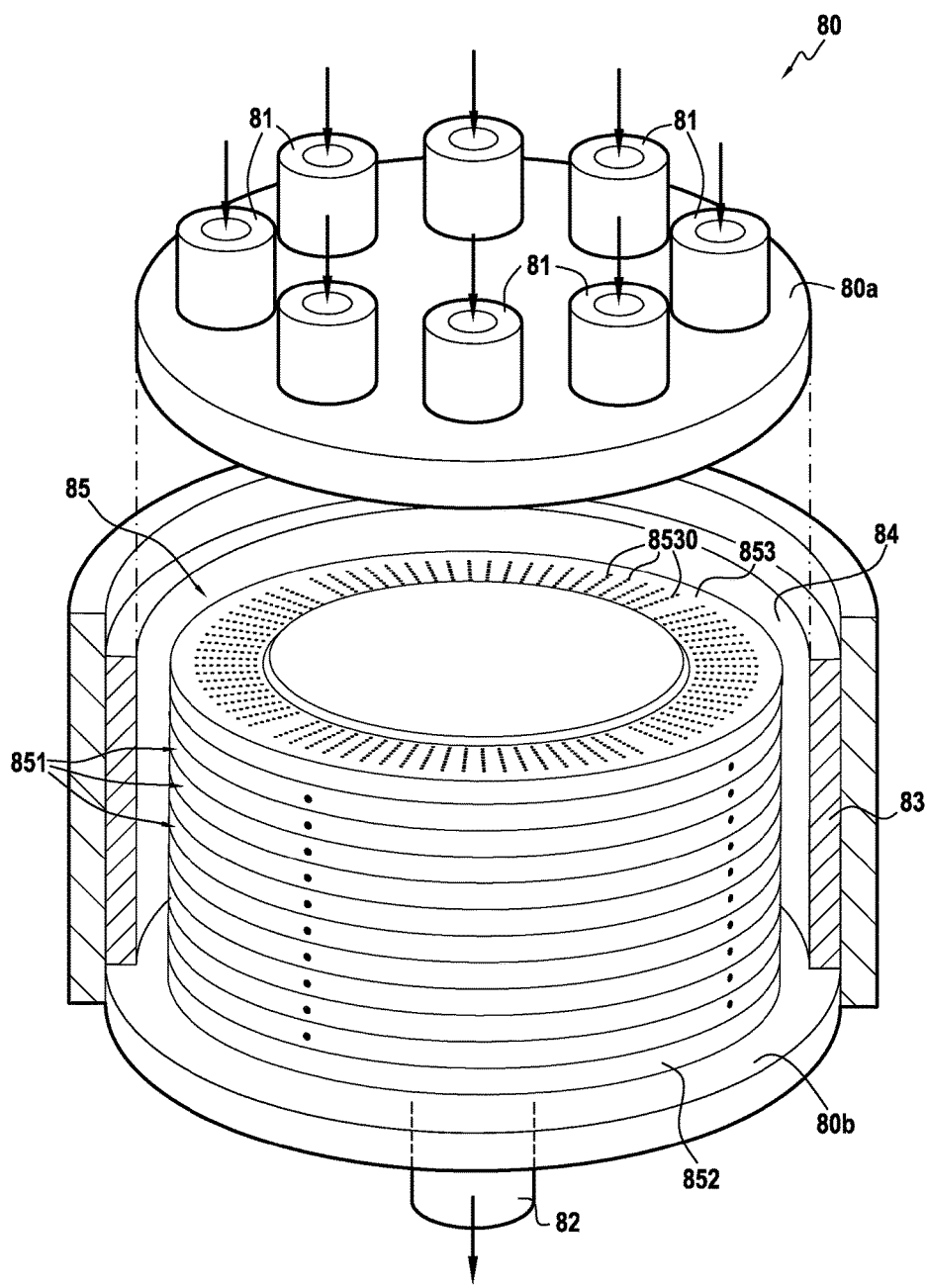
FIG. 13 is a diagrammatic section view showing an installation for densification by chemical vapor infiltration in which substrates are loaded by means of a loader device comprising a plurality of stacked loader stages of the invention of the type shown in FIG. 8.

FIG. 13 is a diagram of a reaction chamber 80 of a chemical vapor infiltration installation or oven having its inside volume 84 defined by a susceptor 83, a lid 80*a* having a plurality of reagent gas feed pipes 81 passing therethrough, and a bottom 80*b* having an exhaust pipe 82 passing therethrough. Porous substrates, such as blade fiber preforms, for example, are loaded inside the chamber 80 by means of a loader device 85 made up of a plurality of loader stages 851 arranged between a bottom plate 852 and a top plate 853. The structure and the operation of the loader device 85 are similar to the structure and the operation of the device 400 described with reference to FIGS. 8 and 9. The feed orifices in the top plate 853 are connected to reagent gas admission pipes 81 in order to feed the loader stages 851 of the device 85. The residual gas exhausted via the exhaust orifices (not shown in FIG. 13) present in the bottom plate 852 is extracted from the chamber via the exhaust pipe 82. The flow of the reagent gas stream through the loader device 85 takes place as shown in FIG. 9.

The reaction chamber 80 could equally well be loaded with porous substrates, such as blade fiber preforms, for example, by using a loader device similar to that of FIG. 11.

Figure 14:
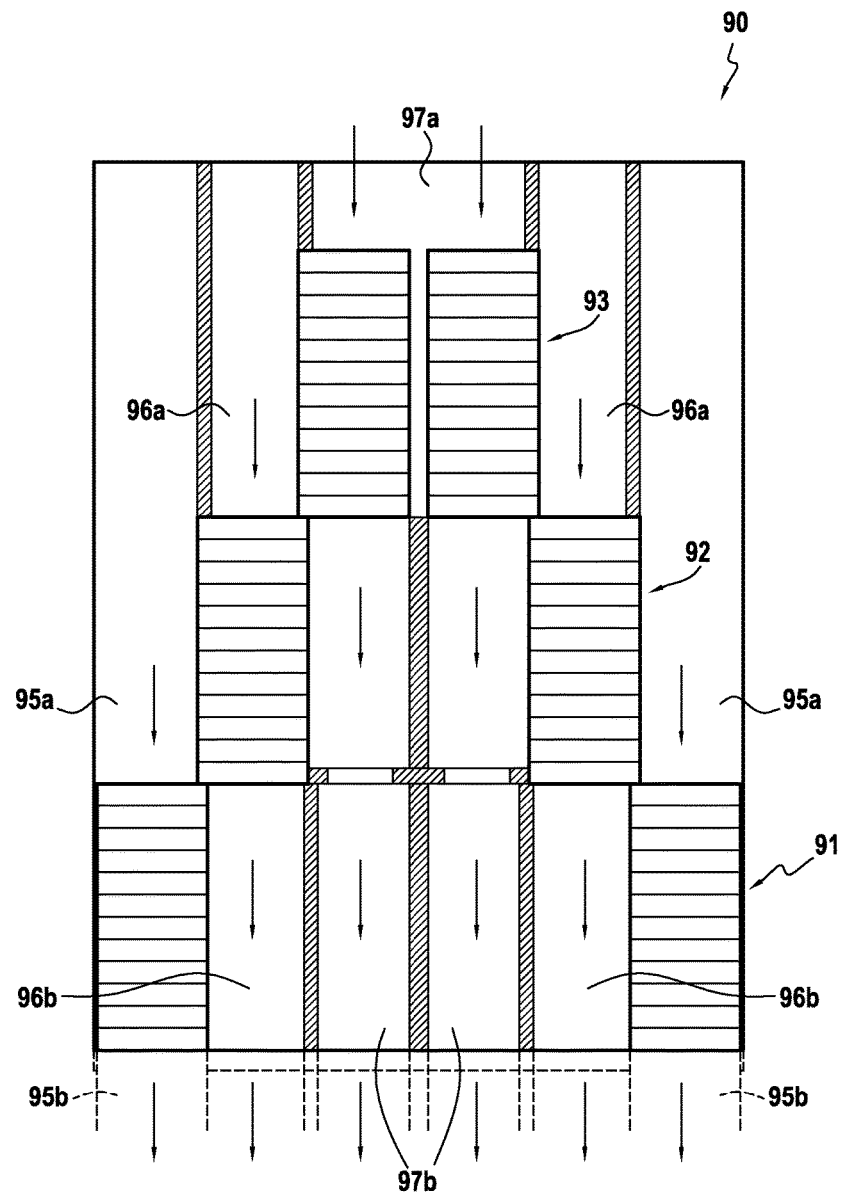
FIG. 14 is a diagrammatic section view showing a pyramid arrangement of a plurality of loader devices, each comprising a plurality of stacked loader stages in an installation of the invention for densification by chemical vapor infiltration.

FIG. 14 shows another possible loading configuration using a pyramid structure. This configuration consists in stacking a plurality of loader devices in a reaction chamber 90 of a chemical vapor infiltration installation or oven, there being three loader devices 91, 92, and 93 of decreasing diameters in this example. The structure and the operation of the loader devices 91, 92, and 93 are similar to the structure and the operation of the device 400 described with reference to FIGS. 8 and 9. The reagent gas is introduced into the loader devices 91, 92, and 93 via respective admission pipes 95*a*, 96*a*, and 97*a*. The residual gas coming from the loader devices 91, 92, and 93 is exhausted via respective exhaust pipes 95*b*, 96*b*, and 97*b*.

Figure 15:
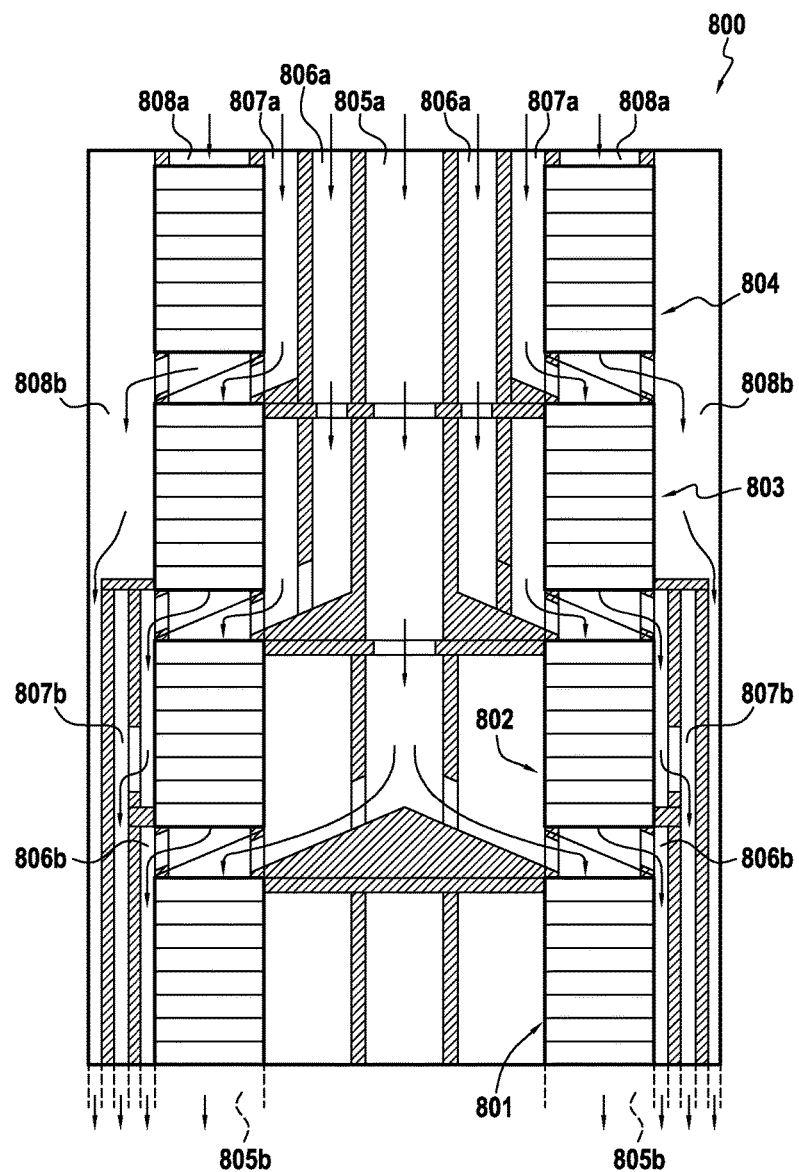
FIG. 15 is a diagrammatic section view showing an arrangement in superposition of a plurality of loader devices comprising a plurality of stacked loader stages in an installation of the invention for densification by chemical vapor infiltration.

In yet another possible loading configuration as shown in FIG. 15, a plurality of loader devices are stacked in a reaction chamber 800 of a chemical vapor infiltration installation or oven, there being four loader devices 801 to 804 of the same diameter in this example. The structure and the operation of the loader devices 801 to 804 are similar to the structure and the operation of the device 400 described with reference to FIGS. 8 and 9. The reagent gas is introduced into the loader devices 801 to 804 via respective admission pipes 805*a*, 806*a*, 807*a*, and 808*a*. The residual gas coming from the loader devices 801 to 804 is exhausted via respective exhaust pipes 805*b*, 806*b*, 807*b*, and 808*b*.

By way of example, all of the elements of the loader device of the invention (walls, plates, substrate support elements, . . . ) may be made out of graphite, out of expanded graphite, or out of a C/C composite material.

With multiple loading made up of a plurality of loader devices, each of them possibly comprising a plurality of loader stages, the adaptation of the densification installation consists merely in feeding reagent gas to each mini-reactor constituted by one of the devices. The reagent gas flow rates are merely multiplied by the number of devices to be fed and the number of loader stages per device. Furthermore, problems of flow in dead zones as encountered using free-flow methods in reaction chambers of large size are eliminated by using loader devices of the invention.

The loader device of the invention also presents the advantage of enabling the load to be prepared in advance, i.e. away from the premises containing the infiltration oven, and for the substrates that are to be densified to be transported with lower risk into the reaction chamber, in contrast to the standard tooling that is conventionally used with a free flow. The time required for loading and unloading chemical vapor infiltration ovens is thus shortened and the handling is made easier.

The invention claimed is:

1. A loader device for loading porous substrates of three-dimensional shapes extending mainly in a longitudinal direction into a reaction chamber of an infiltration oven for densification of the preforms by directed flow chemical vapor infiltration, the device comprising:
- at least one annular loader stage formed by a first annular vertical wall and a second annular vertical wall arranged coaxially relative to each other and defining between them an annular loader space for the porous substrates to be densified;
- a first and a second plate respectively covering the bottom portion and the top portion of the annular loader space;
- each of the first and second annular vertical walls including support elements arranged in the annular loader space, the support elements of the first and second annular vertical walls being in radial alignment so as to define between them unit loader cells each for receiving a respective substrate to be densified; and
- wherein the first annular vertical wall of each loader stage includes at least one gas feed orifice in an outer peripheral surface of said first annular vertical wall, in the vicinity of each unit loader cell, and the second annular vertical wall of each loader stage includes at least one gas exhaust orifice in the vicinity of each unit loader cell,
- wherein the support elements of the first annular vertical wall include notches distributed uniformly in the outer peripheral surface of said first annular vertical wall,
- wherein each notch is located between two reagent gas flow paths, each of the reagent gas flow paths defined between an adjacent gas feed orifice in the first annular vertical wall and a corresponding gas exhaust orifice in the second annular vertical wall, and
- wherein the support elements of the second annular vertical wall include a ring configured to support the substrate and a plurality of pairs of dividers wherein the dividers protrude in the direction of the first annular vertical wall and the dividers include a first end connected to the ring and a second end in contact with the second annular vertical wall, such that a gap in a radial direction is formed between the ring and the second annular vertical wall.

2. A device according to claim 1, comprising a plurality of annular loader stages stacked on one another and arranged between the first and second plates.

3. An installation for densifying porous substrates by chemical vapor infiltration, the porous substrates being of three-dimensional shape that extends mainly in a longitudinal direction, the installation comprising:
- a reaction chamber;
- a reagent gas admission pipe situated at a first end of the chamber; and
- an exhaust pipe situated in the vicinity of a second end of the chamber remote from the first, wherein the chamber contains a plurality of porous substrates of three-dimensional shape extending mainly in a longitudinal direction, said substrates being arranged in a loader device according to claim 2, the at least one gas feed orifice of said device being fed with reagent gas via the reagent gas admission pipe of the chamber.

4. An installation according to claim 3, wherein the porous substrates are fiber preforms for aeroengine blades.

5. A loader device according to claim 1, wherein the first and second annular vertical walls are held coaxially relative to each other by spacers, the ring is fastened to bottom portions of said spacers, and the plurality of pairs of dividers are in radial alignment with the notches in the first annular vertical wall.

6. A loader device according to claim 1, wherein the notches and the gas feed orifices do not overlap.

* * * * *